Jan. 22, 1963 W. A. HELBIG ETAL 3,075,085
SYNCHRONOUS TRANSISTOR AMPLIFIER
EMPLOYING REGENERATION
Filed May 31, 1957
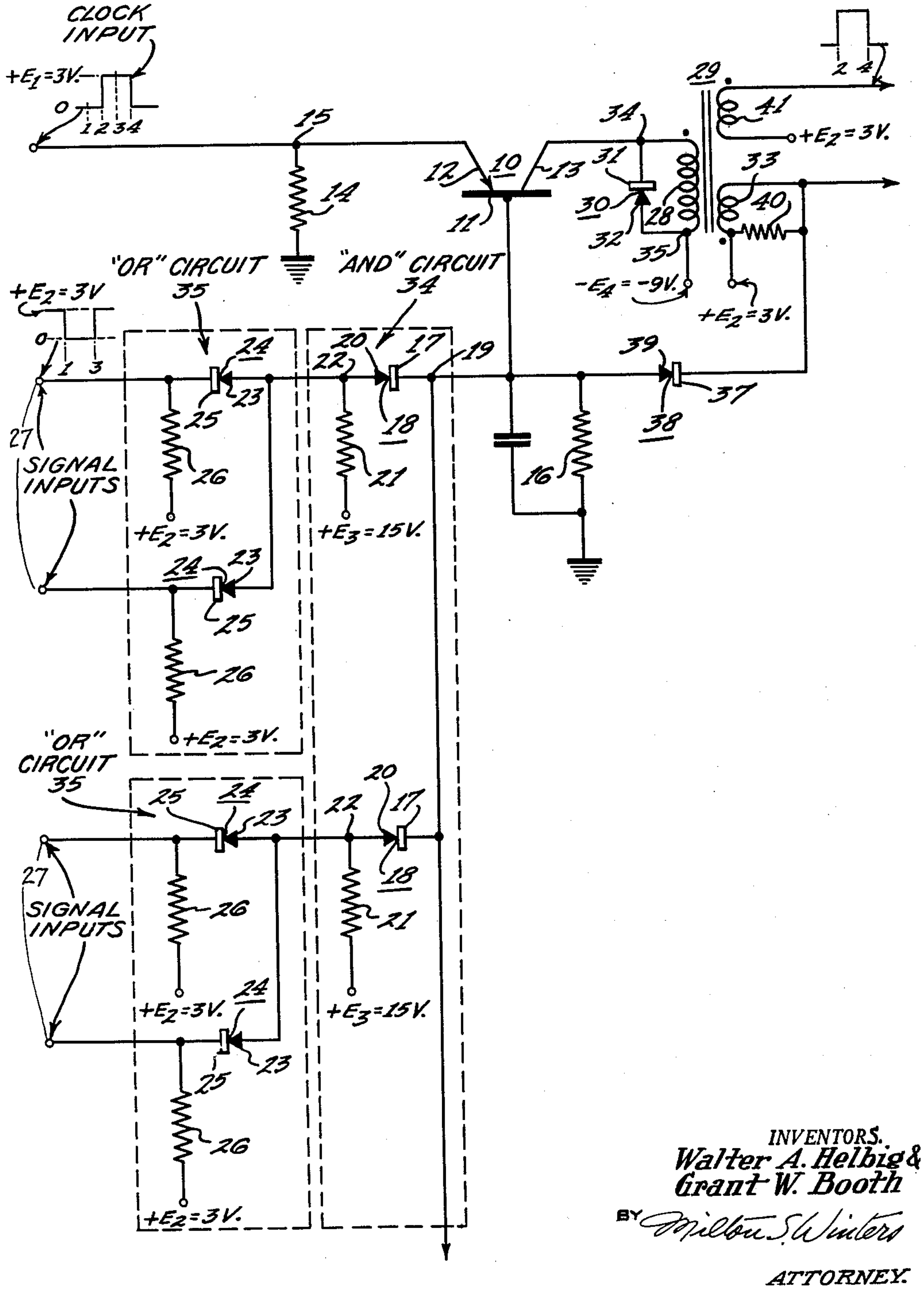
INVENTORS.
Walter A. Helbig &
Grant W. Booth
BY Milton S. Winters
ATTORNEY.

United States Patent Office 3,075,085

Patented Jan. 22, 1963

3,075,085

SYNCHRONOUS TRANSISTOR AMPLIFIER EMPLOYING REGENERATION

Walter A. Helbig, Ashland, and Grant W. Booth, Collingswood, N.J., assignors to Radio Corporation of America, a corporation of Delaware Filed May 31, 1957, Ser. No. 662,833
7 Claims. (Cl. 307—88.5)

The present invention relates to coincidence circuits, and especially to transistor coincidence circuits.

Coincidence circuits are widely used, for example, in electronic computers. One of the desirable features of coincidence circuits in certain computers is the attribute of re-timing or "clocking" the pulses applied to the circuit. For example, signal inputs to the coincidence circuit may come from various sources in which there have been different time delays. It is desirable that the output of the coincidence circuit be precisely timed and have a precise time duration. Similar clocking is often desirable in other electrical circuits.

It is an object of the present invention to provide a coincidence circuit especially well suited for computer use.

Another object of the invention is to provide a transistor coincidence circuit which will clock, or re-time, the input pulse applied thereto in accordance with a clock or master input pulse.

Another object of the invention is to provide a novel transistor coincidence circuit.

Other objects, advantages and novel features of the invention will be more fully apparent from the following description when read in connection with the accompanying drawing, in which the sole FIGURE is a diagram schematically illustrating one embodiment of the invention.

In accordance with the invention, a transistor amplifier is employed in which the clock input or timing pulse is applied to the emitter, and another pulse is applied to the base. The transistor collector is connected by a regenerative feedback connection to the transistor base. The quiescent voltages are arranged so that the transistor is normally non-conductive, and so that a coincidence of inputs to the base and emitter is necessary before the normally non-conductive transistor becomes conductive. Thereafter, by virtue of the regenerative feedback, the transistor remains conductive until the clock input terminates. The output may be taken from the collector circuit. As will appear more fully hereinafter, the output is precisely timed to correspond in initiation and time duration to the clock input.

With reference to the figure, a transistor 10 of the N conductivity type has a base 11, an emitter 12 and a collector 13. A resistor 14 is connected between the emitter 12 and a voltage reference point (ground) indicated by the conventional ground symbol. At the junction 15 between the emitter 12 and the resistor 14, the clock input may be applied. It will be understood that all signals and voltages in this circuit are applied between the indicated terminal and ground.

A parallel resistor capacitor combination 16 is connected between the base 11 and ground. The cathodes 17 of several diodes 18 are connected by a junction 19 to the base 11. The anodes 20 of the diodes 18 are connected respectively through resistors 21 to a voltage supply +E3. Diodes 18 and resistors 21 are thus connected in an "and" circuit 34. To each of the junctions 22 between the anodes 20 and resistors 21 are connected a different plurality of anodes 23 of diodes 24. The cathodes 25 of the diodes 24 are connected through respective resistors 26 to a voltage supply +E2. The various signal inputs are applied respectively to the terminals 27 which are connected respectively to the diode cathodes 25.

Thus, those diodes 24 having their anodes 23 connected to any one junction 22 form an "or" circuit 35.

The dotted terminal of a primary winding 28 of a transformer 29 is connected to the collector 13 of transistor 10. The undotted terminal of this primary 28 is connected to a voltage —E4. A damping diode 30 is connected across the transformer 28 with its cathode 31 connected to the dotted terminal and the collector 13 and with its anode 32 connected to the undoted terminal and the voltage —E4. A feedback secondary winding 33 of the transformer 29 has its dotted terminal connected to the cathode 37 of a feedback diode 38 and to a voltage +E2. The anode 39 of the feedback diode 38 is connected to the base 11 of transistor 10. A damping resistor 40 is connected between the terminals of the feedback secondary 33. An output secondary 41 is provided having a dotted terminal from which the voltage output for another stage may be taken and an undotted terminal to which may be applied the voltage +E2.

In operation, the signal inputs are applied respectively to the cathodes 25 of the various diodes 24. The signal inputs are negative going signals. The cathodes 25 of the "or" circuit diodes 24 have a normal quiescent value of +E2 due to the bias through resistors 26. One or more signal inputs to any one "or" circuit 35 causes a current flow through the diode 24 receiving such an input. Accordingly, the signal appears at the junction 22 corresponding to that "or" circuit 35. Every junction 22 must receive a negative going input signal before a negative going input signal appears at the "and" circuit 34 output junction 19 and the base 11. There may be as many "or" circuits as desired. The "and" circuit 34 may have as many inputs as desired. Only a single input may be applied directly to the base 11.

Time relations between the signal input pulses, the clock pulse, and the output pulse are indicated by the pulse forms illustrated on the figure. The numerals 1, 2, 3, and 4 indicate successive times at which, respectively, a signal pulse may be initiated, a clock pulse may be initiated, a signal pulse may terminate, and the clock and output pulses may terminate. The initiation of the clock input may follow closely the initiation of the signal input to the base 11. As soon as the clock input is initiated, the emitter 12 rises in voltage, and the transistor 10 quickly reaches saturation. An amplified positive pulse appears at the collector 13 causing current (conventional) to flow through the transformer primary 28 from the dotted to the undotted terminal. The dots at the transformer windings have the conventional meaning. Accordingly, the undotted terminal of transformer 33 is driven negatively from the value of +E2, and a regenerative current flows through the diode 38, which is poled to pass this current in the forward direction of diode 38. This current flow is in a direction to maintain the transistor 10 saturated. In other words, the emitter to base diode of the transistor 10 carries this regenerative current in its forward direction. The signal input pulse at base 11 may terminate before the clock input pulse terminates. However, due to this regenerative current through feedback diode 38, the transistor 10 remains saturated. This transformer 29 is a pulse transformer, suited to the time duration of the pulses here involved. Therefore, the output pulse at the transformer 29 persists until the clock input pulse terminates. When the clock input pulse terminates, the transistor 10 ceases conduction. Current flow through the transformer primary winding 28 is cut off. Any possible oscillation due to the resultant shock excitation of the primary winding 28 is damped by virtue of the damping diode 30. In other words, the dotted terminal of the primary winding 28 cannot go negative with respect to the undotted terminal thereof without drawing heavy current through the diode 30, thus dissipating the oscillatory energy. Also, the diode 38 now tends to block current flow between base 11 and the transformer 29. If a positive voltage output is desired, it may be taken from the dotted terminal of the secondary winding 41. A negative output may be taken from an undotted terminal of the secondary winding 33. These outputs may be used in any suitable fashion with other logic circuits, for example, circuits similar to the one illustrated.

The combination 16 affords a quick rise time and a fast saturation for the transistor 10 when the latter is to become conductive, yet the resistor of the combination 16 avoids excess current flow through the transistor for too long a period of time. The resistor 14 keeps the emitter 12 near ground potential during quiescence.

This system has been described with the clock input pulse initiated after the initiation of the signal input, and terminated before the termination of the signal input. One computer system, for example, has four sets of clock input pulses corresponding to four different phases of an A.C. voltage. Accordingly, with suitable circuit delays, the output pulses of any circuit may be delayed, yet start a little sooner at the succeeding circuit than the initiation of the clock pulse corresponding to the succeeding phase.

Note that the output of the circuit of the invention provides a pulse which is standard both in amplitude and time duration, since the amplitude corresponds to the saturation current of the transistor, and the time duration is controlled by the clock pulse. Such standardization is especially useful in computer work and in certain other types of pulse circuitry. The circuit responds to low level signal input at high speed to provide a standard, "clocked" output.

What is claimed is:

1. A transistor circuit comprising a transistor having an emitter, a collector, and a base, means for biasing said transistor in a normally non-conductive state, means for applying a clock pulse of one voltage polarity between said emitter and base tending to make said transistor conductive from said emitter to said base, means for concurrently applying a signal pulse of an opposite voltage polarity in the forward direction between said emitter and base, and a normally open regenerative feedback path from said collector to said base which, in response to conduction through said transistor, closes and feeds back to said base a signal of said opposite polarity, so as to maintain said transistor conducting for the duration of said clock pulse.

2. A transistor circuit comprising a transistor of the N conductivity type having an emitter, a collector, and a base, a common ground connection, a resistor and a capacitor connected in parallel between said base and said ground connection, means to apply a negative going pulse between said base and said emitter, means to apply a positive going pulse the leading edge of which occurs during the interval of the negative going pulse between said base and said emitter, a regenerative feedback path from said collector to said base including a transformer having a primary winding connected to said collector and a secondary winding connected to said base, and a diode which is normally biased to cut-off in said path poled to be rendered conductive in response to conduction through said transistor and to carry transistor emitter to base current through said diode in the easy direction of diode current flow and an output circuit coupled to said collector for producing an output pulse which is substantially time coincident with said positive going pulse.

3. A gate circuit comprising a transistor having an emitter electrode, a collector electrode, and a base electrode; a source of a direct current control pulse; circuit means to apply said control pulse to said transistor between a first pair of said electrodes, said transistor being biased to provide a low impedance between a second pair of said electrodes only in the presence of said control pulse; a source of a direct current clock pulse, said clock pulse overlapping at least a portion of said control pulse in time and having its leading edge trailing the leading edge of said control pulse; circuit means to apply said clock pulse between a pair of said electrodes for transmission through said transistor; a normally open regenerative feedback circuit connected between one of said first pair of electrodes and one of said second pair of electrodes; and means in said feedback circuit responsive to the transmission of said clock pulse through said transistor for closing said feedback circuit and applying a signal derived from the clock pulse transmission through said transistor, through said feedback circuit to maintain said transistor conducting for the clock pulse interval.

4. A gate circuit comprising, a transistor having an emitter electrode, a collector electrode, and a base electrode; a source of direct-current control pulse; circuit means to apply said control pulse to said transistor between said emitter and base electrodes in the forward direction; a source of a direct-current clock pulse synchronized with said control pulse, said clock pulse overlapping at least a portion of the control pulse in time and having its leading edge trailing the leading edge of said control pulse; circuit means to apply said clock pulse to said emitter electrode for transmission through said transistor to said collector electrode; and a regenerative circuit connected between said collector and base electrodes, said circuit including a diode which is normally biased to cut-off, and means responsive to current flow through said transistor for rendering said diode conductive and permitting a signal derived from said current flow to be applied through said diode to said base electrode in a sense to maintain said transistor conducting.

5. In a system including means for producing clock pulses and means for producing other pulses, a circuit for producing an output pulse in substantial time coincidence with a clock pulse whenever one of said other pulses overlaps the leading edge of a clock pulse comprising, in combination, a normally cut off transistor having base, collector and emitter electrodes; means for applying said other pulses in the forward direction to the base of said transistor between said base and emitter; means for applying said clock pulses in the forward direction to the emitter of said transistor between said emitter and base; and a regenerative feedback connection from the collector to the base of said transistor, said connection including a normally open switch which closes in response to current flow through said transistor and permits a regenerative signal derived from said current flow to be applied to said base.

6. In combination, means for producing clock pulses; means for producing other pulses; and a circuit for producing an output pulse in substantial time coincidence with a clock pulse whenever one of said other pulses overlaps the leading edge of a clock pulse comprising a normally cut off transistor, having base, collector and emitter electrodes, means for applying said other pulses in the forward direction to the base of said transistor between said base and emitter, means for applying said clock pulses in the forward direction to the emitter of said transistor between said emitter and base, and a regenerative feedback circuit connected between the collector and base of said transistor, said feedback circuit including a series connected diode which is normally biased to cut-off and thereby normally prevents the aplication of a feedback signal to said base, and means responsive to current flow at the collector electrode of said transistor for rendering said diode conductive and permitting a regenerative signal derived from said current flow to be applied through said diode to said base of said transistor.

7. A transistor circuit comprising a transistor having an emitter and base between which a first signal of one polarity may be applied in the forward direction, and between which a second signal of opposite polarity may be applied also in the forward direction, and a collector; a regenerative feedback path from said collector to said base, said path including a diode connected in series in said path, said diode being normally biased to cut-off and poled to be rendered conductive in response to conduction through said transistor to carry transistor emitter to base current through said diode in the easy direction of diode current flow; a resistor and capacitor connected in parallel with each other between said base and a point of reference potetnial; and an output circuit coupled to said collector for producing an output signal which is time coincident with said first signal when the leading edge of said first signal occurs during said second signal.

References Cited in the file of this patent

UNITED STATES PATENTS

| | | |
|---|---|---|
| 2,556,286 | Meacham | June 12, 1951 |
| 2,644,893 | Gehman | July 7, 1953 |
| 2,675,474 | Eberhard | Apr. 13, 1954 |
| 2,679,594 | Fromm | May 25, 1954 |
| 2,727,146 | Fromm | Dec. 13, 1955 |
| 2,748,282 | Gorski | May 29, 1956 |
| 2,757,243 | Thomas | July 31, 1956 |
| 2,758,205 | Lubkin | Aug. 7, 1956 |
| 2,758,206 | Hamilton | Aug. 7, 1956 |
| 2,760,087 | Felker | Aug. 21, 1956 |
| 2,777,092 | Mandelkorn | Jan. 8, 1957 |
| 2,787,707 | Cockburn | Apr. 2, 1957 |
| 2,802,118 | Simkins | Aug. 6, 1957 |
| 2,810,080 | Trousdale | Oct. 15, 1957 |
| 2,823,856 | Booth | Feb. 18, 1958 |
| 2,825,813 | Sperling | Mar. 4, 1958 |
| 2,838,690 | Eckert | June 10, 1958 |
| 2,885,572 | Felker | May 5, 1959 |
| 3,025,412 | Felker | Mar. 13, 1962 |